United States Patent [19]

Endo et al.

[11] Patent Number: 4,870,475
[45] Date of Patent: Sep. 26, 1989

[54] SEMICONDUCTOR DEVICE AND METHOD OF MANUFACTURING THE SAME

[75] Inventors: Nobuhiro Endo; Tsuneo Hamaguchi, both of Tokyo, Japan

[73] Assignee: NEC Corporation, Japan

[21] Appl. No.: 925,717

[22] Filed: Oct. 29, 1986

[30] Foreign Application Priority Data

Nov. 1, 1985 [JP] Japan ............................. 60-246517
Dec. 9, 1985 [JP] Japan ............................. 60-277244
Dec. 12, 1985 [JP] Japan ............................. 60-280617
Dec. 12, 1985 [JP] Japan ............................. 60-280618

[51] Int. Cl.[4] ................... H01L 23/48; H01L 23/30
[52] U.S. Cl. ................................... 357/71; 357/43; 357/49
[58] Field of Search .................... 357/43, 49, 50, 71, 357/54, 67

[56] References Cited

U.S. PATENT DOCUMENTS 4,292,730 10/1981 Ports ........................................ 357/49
4,523,963 6/1985 Ohta et al. ............................. 357/54
4,543,595 9/1985 Vora ....................................... 357/67

OTHER PUBLICATIONS

"MOS Transistors in Thin Monocrystalline Silicon Layers", J. A. van Nielen, M. J. J. Theunissen and J. A. Apples.

"Thin Silicon Film on Insulating Substrate", Greg L. Kuhn and C. John Rhee, Motorola Incorporated, Semiconductor Research and Development Laboratories, Semiconductor Products Division, Phoenix, Arizona 85008.

"Silicon-On-Insulator (SOI) by Bonding and Etch-Back", J. B. Lasky, S. R. Stiffler, F. R. White, J. R. Abernathey, IBM General Technology Division Essex Junction, Vermont 05452.

Primary Examiner—Rolf Hille
Assistant Examiner—S. V. Clark
Attorney, Agent, or Firm—Laff, Whitesel, Conte & Saret

[57] ABSTRACT

A method of manufacturing a semiconductor device, has the steps of forming an element on a semiconductor substrate, adhering an element formation surface of the semiconductor substrate to another substrate through an insulating adhesive layer, removing the semiconductor substrate till the element formation layer is exposed, forming an insulating film on the element formation layer, removing the insulating film at a portion where contact holes are to be formed to expose the element formation layer or till the underlying element formation layer is exposed to expose electrode wirings, and forming wiring patterns connected thereto. A bipolar transistor manufactured by this method is also disclosed.

7 Claims, 9 Drawing Sheets

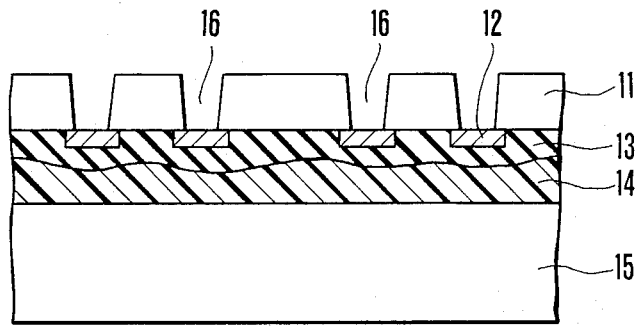
F I G. 4
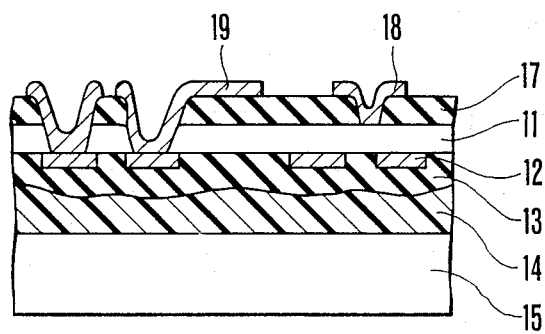
F I G. 5

To (d)

SEMICONDUCTOR DEVICE AND METHOD OF MANUFACTURING THE SAME

BACKGROUND OF THE INVENTION

The present invention relates to a semiconductor device and, more particularly, to a bipolar transistor and a method of manufacturing the same.

When a functional element such as a switching element is formed on a semiconductor substrate, the depth of the substrate occupied by the element is only 10 μm from the substrate surface. Therefore, in many cases, the semiconductor substrate region remaining after formation of the element is preferably replaced with an insulating substrate in terms of the characteristics. For example, a semiconductor element on the insulating substrate is called SOS (Silicon On Sapphire) and is effective for a high speed and a high withstand voltage of the element. However, many defects are present in the SOS due to heteroepitaxially grown crystals, resulting in poor characteristics. For this reason, a method of fixing an element surface layer preformed on a semiconductor monocrystalline substrate to a first supporting substrate using an adhesive, forming the substrate thin by etching or the like, fixing the resultant surface to a second supporting substrate using an adhesive, and removing the first supporting substrate to expose the element surface is reported (Japan. J. Appl. Phys., Vol. 23, No. 10, pp. L 815, 1984). A semiconductor device manufactured in such a manner is shown in FIG. 1. In FIG. 1, reference numeral 1 denotes a semiconductor layer; 2, a bonding pad; 3, a protecting insulating film; 4, an adhesive layer; and 5, a supporting substrate. As shown in FIG. 1, the bonding pad and wirings exist on only one surface of the semiconductor device. Moreover, when a CMOS is formed in the manner described above, since the substrate region of the transistor is not connected to a constant power source but is floating, the operation margin is narrowed. Conventionally, in order to form an npn bipolar transistor, an n+-type buried impurity layer is formed by an ion-implantation method in a region to serve as an element active region on a p-type silicon substrate to obtain a collector region, an n−-type layer is epitaxially grown on the collector region, a p-type base diffusion region is formed and an n+-type emitter region is formed therein (IEEE, J. Solid-State Circuit, Vol. SC-16, No. 5, pp. 424–429, 1981).

FIG. 2 is a sectional view showing a conventional npn bipolar transistor. In FIG. 2, reference numeral 101 denotes a p-type silicon substrate; 102, an n+-type buried impurity layer; 103, an n-type epitaxial layer; 104, a p-channel stopper region; 105, a field oxide film; 106, a base diffusion region; 107, an emitter contact region; 108, a collector contact region; 109, an interlayer insulating film; and 110, electrode wirings.

In such a bipolar transistor, the following two factors are required. First, in order to improve a switching rate of a transistor, the resistance of the conventional buried impurity layer 102 must be reduced. Second, an element isolation region must be reduced in area to obtain a high packing density. However, a conventional structure cannot satisfy these two requirements at the same time. More specifically, if the impurity concentration of an n+-type buried impurity layer 102 is increased to decrease its resistance and an n-type epitaxial grown layer 103 is to be grown, an impurity doping called an auto-doping tends to enter, so that an n-type epitaxial grown layer must be formed thick to obtain a low-concentration epitaxial surface. As a result, when a thick epitaxial film is isolated by a field oxide film 105, the amount of an oxide film which enters into a nitride film, i.e., the amount of bird's beak is increased, resulting in a large element isolation region. As described above, when a collector resistance is decreased to obtain a high-speed, a size required for element isolation is increased, thereby preventing a high element packing density. A transistor structure or a means which realizes a high speed and a high packing density of a bipolar transistor has not been reported yet.

In addition, in a conventional bipolar transistor, emitter, base, and collector regions are sequentially arranged in this order in a semiconductor layer surface. Since wiring electrodes are connected to respective regions, it is difficult to decrease the unit size of a transistor or is necessary to provide a margin for wiring regions so that respective wirings do not cross each other, thereby preventing a high element packing density.

SUMMARY OF THE INVENTION

It is an object of the present invention to provide a semiconductor device and a method of manufacturing the same, which eliminate the above conventional drawbacks.

A semiconductor device according to the present invention comprises a substrate, an insulative adhesive layer formed on the substrate, a field oxide film formed on the insulative adhesive layer and in which an element is formed, and a semiconductor layer which remains on the element and the field oxide film after removal thereof and formed with a contact hole through which the element is connected with outside of the semiconductor device.

A method of manufacturing a semiconductor device according to the present invention comprises the steps of forming an element surrounded by a field oxide film on first semiconductor substrate, forming an insulating adhesive layer on the element surrounded by the field oxide film, adhering second semiconductor substrate on the insulating adhesive layer, removing the first semiconductor substrate till the field oxide film is exposed, forming an insulating film on a surface from which the first semiconductor substrate has been removed, removing the insulating film at a portion where contact holes are to be formed to expose the element, and forming wiring patterns connected to the element.

BRIEF DESCRIPTION OF THE DRAWINGS

FIG. 4 is a sectional view of an embodiment of a semiconductor device manufactured by the method of FIG. 3;

FIG. 5 is a sectional view of another embodiment of the semiconductor device manufactured by the method of FIG. 3;

DETAILED DESCRIPTION OF THE PREFERRED EMBODIMENTS

Embodiments of the present invention will now be described in detail with reference to the accompanying drawings.

Figure 3A:
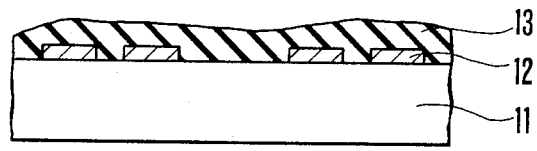
FIGS. 3(a) to 3(d) are sectional views showing steps of an embodiment of a method of manufacturing a semiconductor device according to the present invention.
Figure 3B:
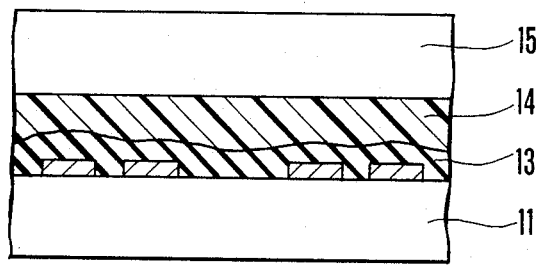
Figure 3C:
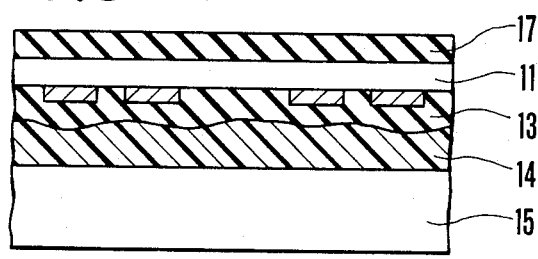
Figure 3D:
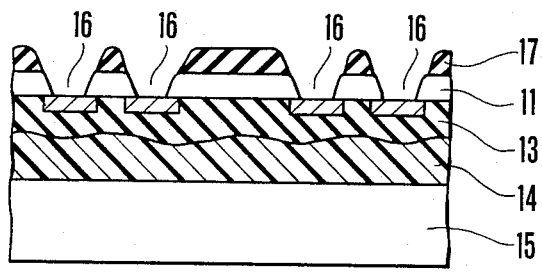

FIGS. 3(a) to 3(d) show an embodiment of a method of manufacturing a semiconductor device according to the present invention. First, a MOS integrated circuit is formed on a silicon substrate 11 by a conventional silicon element formation process such as an element isolation region formation method using a Local Oxidation of Silicon (LOCOS) method, and an aluminum bonding electrode 12 and a wiring protecting film 13 are formed on a surface of the substrate 11, as shown in FIG. 3(a). Then, an adhesive 14 such as an epoxy high polymeric resin or a low-melting glass is coated on the protecting film 13, and a supporting substrate 15 is fixed on the adhesive 14, as shown in FIG. 3(b). The supporting substrate may be a silica glass substrate, a silicon substrate having a thick oxide film formed on its surface, or a conductor substrate in accordance with the purpose. The silicon substrate 11 is removed from its back surface to obtain a desired thickness using mechanochemical polishing. For example, when colloidal silica as a grit and an organic amine as a chemical liquid are used, an insulating film of a silicon oxide film for element isolation can be used as a stopper to polish a silicon layer, thereby extremely improving the reproducibility. Subsequently, an insulating film 17 is deposited at a low temperature to protect a polished silicon surface. The heat resistance of the adhesive 14 must be taken into consideration in selecting a method of depositing an insulating film. However, when a CVD method utilizing an optical CVD or an electronic oscillation discharge is used, a dense film can be formed at a temperature of 100° C., as shown in FIG. 3(c). Thereafter, contact holes 16, which are smaller than a bonding pad, are patterned using a conventional photolithography. Since a portion in the semiconductor substrate 11 in which a bonding pad is formed is a field region of a silicon oxide film, a contact hole region together with a surface protecting insulating film 17 formed on the field region are etched, as shown in FIG. 3(d).

FIG. 4 shows a semiconductor device obtained when the protecting film 17 is removed after the step of FIG. 3(d). As shown in FIG. 4, a chip surface faces a side opposite to that of a conventional semiconductor device, and the contact holes 16 for bonding are open from the side of the semiconductor layer 11. The contact holes 16 can be used not only for bonding but also for wiring in the chip. Although such a structure is entirely opposite to that of a conventional semiconductor device, the operation of the semiconductor device totally remains the same.

FIG. 5 is a sectional view of another embodiment having two-layered wiring manufactured by the method shown in FIGS. 3(a) to 3(d). In this embodiment, wiring patterns 18 and 19 are formed after the contact holes are opened. The wiring pattern 18 does not reach the electrode 12 but contacts a substrate region of a MOS transistor formed in the Si layer 11. When a reference voltage is applied to the wiring pattern 18, the potential of the substrate region can be stabilized.

In the semiconductor device having the above structure, contact holes are opened from the back surface of the semiconductor layer in which an element and wirings are already formed to perform electrode wiring such as bonding, so that the wirings can be easily multi-layered.

In addition, it is conventionally difficult to form an electrode for a substrate potential control in a conventional SOS (Silicon On Sapphire) or an SOI. However, a conventional photolithography using the contact holes and vapor deposition of a wiring metal can be used in the semiconductor device having the above structure, thereby significantly stabilizing and improving the micro element characteristics.

Accordingly, the manufacturing steps are significantly reduced and the manufacturing yield is greatly improved as compared with those of a conventional method. At the same time, since an adhesive need not be removed in this method, a material such as a low-melting glass having a melting point higher than that of an organic adhesive can be used, resulting in a wide range of selection of materials, i.e., adhesives. In addition, multi-layered wirings of 2 to 4 layers are generally formed in a surface at one.side of a conventional integrated circuit. However, in the structure of the present invention, since both sides of the semiconductor layer can be used, 4 to 8 layers can be advantageously formed using conventional techniques only, thereby greatly facilitating the manufacture of integrated circuits requiring a high packing density.

Moreover, it is obvious that the present invention can be applied not only to a MOS integrated circuit but also to a bipolar integrated circuit (bipolar MOS (BIMOS) integrated circuit) or a GaAs integrated circuit, and is not limited by the type of device or material.

Figure 6A:
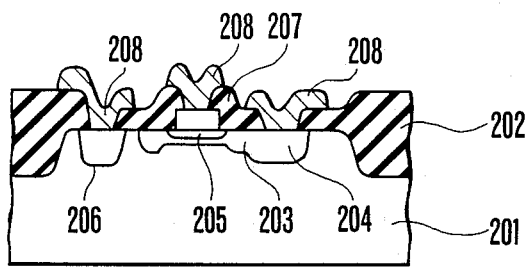
FIGS. 6(a) to 6(d) are sectional views showing steps of another embodiment of a method of manufacturing a semiconductor device according to the present invention.
Figure 6B:
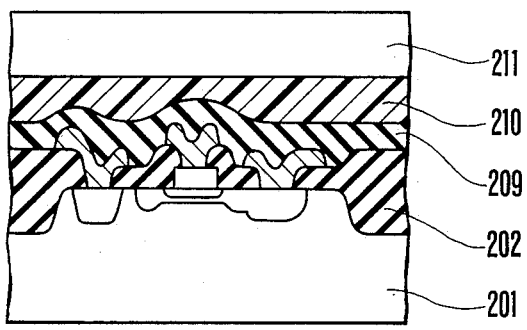
Figure 6C:
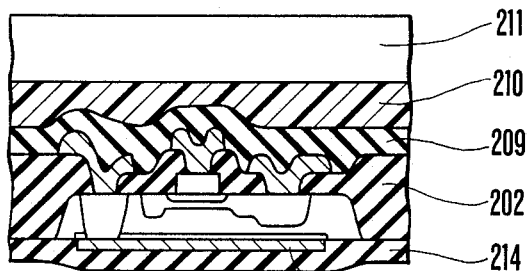
Figure 6D:
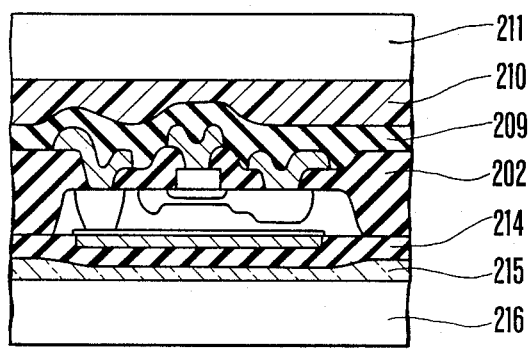
Figure 7:
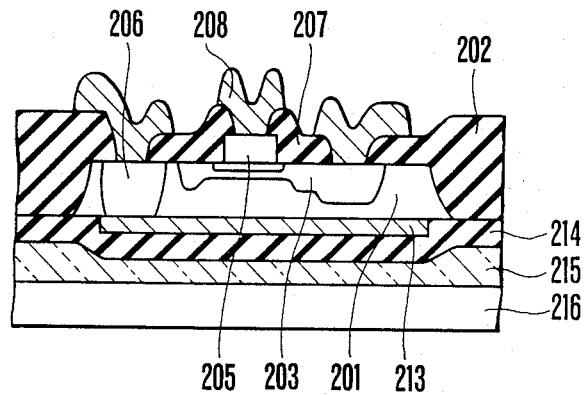
FIG. 7 is a sectional view of an embodiment of a a bipolar transistor manufactured by the method of FIG. 6.

FIGS. 6(a) to 6(d) show the steps of a method of manufacturing a semiconductor device according to the present invention, and FIG. 7 shows a semiconductor device obtained by the method of FIGS. 6(a) to 6(d). First, a field oxide film 202 having a thickness of 1 μm for element isolation is formed on a p-type silicon substrate 201 having a specific resistance of about 10 Ω.cm by the LOCOS method. Then, a p-type base diffusion region 203, a p+-type base contact region 204, an n+-type emitter region 205, and a collector contact region 206 are formed by a conventional bipolar device process technique. Thereafter, an interlayer insulating film 207 is deposited, contact holes are opened, a wiring electrode material such as an aluminum film is sputter-deposited, and electrode wirings 208 of a base, an emitter, and a collector are formed and alloyed, as shown in FIG. 6(a). After a silicon oxide film 209 as a protecting film is deposited by the CVD method, an adhesive layer 210 such as an epoxy high polymeric resin layer is spin-coated, and then another supporting substrate 211 is adhered to the processed surface of the resultant semiconductor substrate, as shown in FIG. 6(b). The silicon substrate 201 is removed from its back surface till the bottom of the field oxide film 202 is exposed using mechanopolishing. For example, when colloidal silica as a grit and an organic amine as a chemical liquid are used, a silicon layer can be polished using the silicon oxide film 202 as a stopper, thereby obtaining a thin, flat, and smooth silicon layer. Subsequently, the polished silicon surface is rendered n-type by the ion-implantation, aluminum is sputter-deposited, and a low-resistance collector region is patterned so that only an element active region remains. The resultant structure is alloyed at a temperature of 200° C. or less to form a metal ohmic contact layer 213, and then a protecting film 214 (i.e., an SiO$_2$ film) is deposited. A temperature used for the above alloying and the CVD of the protecting film preferably falls within a range in which the adhesive layer 210 can be stable, and a temperature of 200° C. is used in this embodiment. However, when a polyimide adhesive having a higher heat resistance is used, a temperature exceeding 200° C. may be used. The resultant structure is shown in FIG. 6(c). Then, an adhesive layer 215 of low-melting glass, i.e., lead glass, having the property different from that of the adhesive layer 210 described above is formed, and another supporting substrate 216, i.e., a glass substrate, is adhered thereto, as shown in FIG. 6(d). Finally, the resultant structure is dipped into a solvent i.e., the TRICRENE, which melts the adhesive layer 210 without melting the adhesive layer 215, so that the supporting substrate 211 can be easily stripped. The resultant structure is shown in FIG. 7. The protecting film 209 on the bonding pad can be removed using the photolithography as needed.

In this embodiment, an aluminum metal is used for the low-resistance collector region, but a metal silicide may be used.

In addition, if wiring is performed at the side of the metal ohmic contact layer between collectors without forming the collector contact region 206 and the collector contact electrode 208, the unit size of a bipolar transistor can be significantly decreased. For example, a unit size in which emitter, base, and collector regions are arranged in a line is conventionally 21 μm, but it can be decreased to 14 μm if wiring is performed at the side of the metal ohmic contact layer using the same design rule. As a result, it is confirmed that a high packing density can be achieved by the effect of the present invention.

Figure 9:
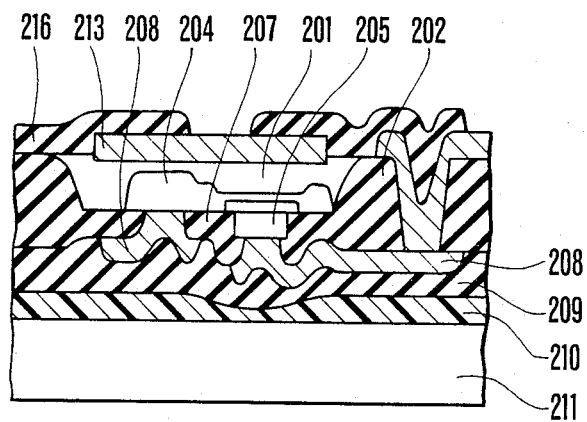
FIG. 9 is a sectional view of a bipolar transistor manufactured by the method of FIG. 8.

FIGS. 8(a) to 8(d) show the steps of another embodiment of a method of the present invention, and FIG. 9 is a sectional view of a semiconductor device manufactured by the method of FIGS. 8(a) to 8(d). Similar to FIGS. 6(a) and 6(b), the silicon substrate is removed till the bottom of the field oxide film 202 is exposed, and the polished silicon surface is rendered n-type in FIGS. 8(a) and 8(b).

Figure 8A:
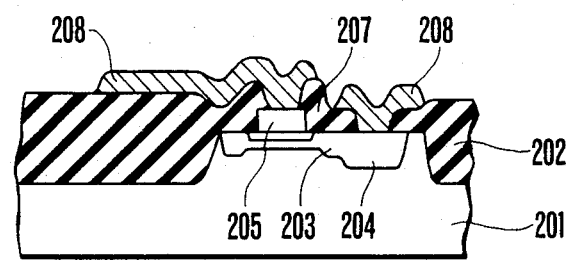
FIGS. 8(a) to 8(d) are sectional views showing steps of still another embodiment of a method of manufacturing a semiconductor device according to the present invention.
Figure 8B:
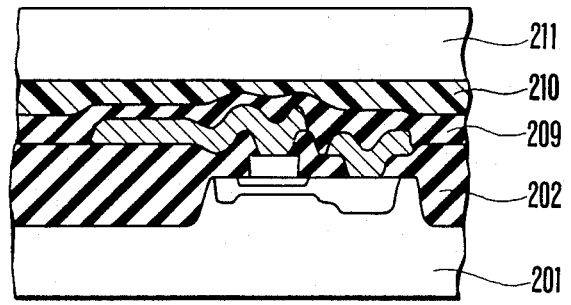
Figure 8C:
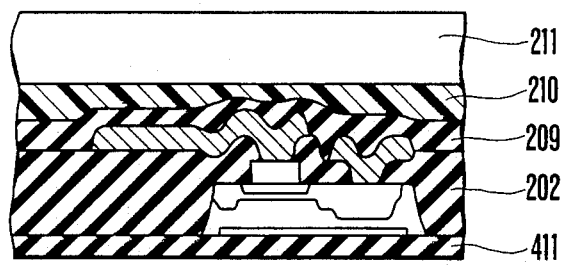
Figure 8D:
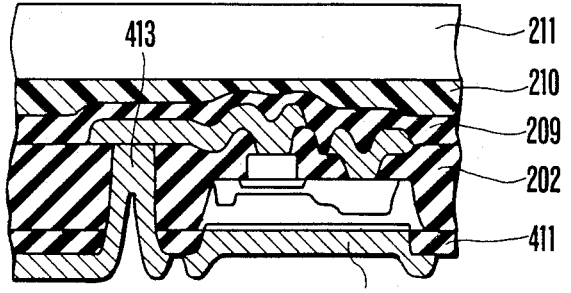

An interlayer insulating film 411 such as a silicon oxide film is deposited by the CVD method, as shown in FIG. 8(c). Then, holes are opened in the interlayer insulating film 411 and the field oxide film 202 on the collector region by photolithography, and a metal such as aluminum is sputter-deposited. Thereafter, patterns of a collector electrode wiring 412 and an electrode 413 are formed by photolithography, as shown in FIG. 8(d).

FIG. 9 shows an npn bipolar transistor obtained by depositing the protecting film 216 such as a silicon nitride film by the plasma CVD method and opening a hole in the resultant structure for the bonding pad.

According to the present invention, since the collector electrode is formed at the side of the semiconductor layer opposite to the base and emitter electrodes, the unit size of the transistor is determined by the base and emitter regions, thereby significantly reducing the unit size of the transistor and contributing to a high speed.

On the other hand, like a conventional method, the collector contact region 108 (FIG. 2) may be provided to form wirings of the collector electrode at the same side as those of the emitter and base electrodes.

In the above embodiment, the conventional collector region is replaced with a metal silicide or a metal having a sheet resistance 1/10 to 1/1,000 that of a silicon layer doped with a high-concentration impurity, so that a collector resistance is significantly reduced to advantageously allow a high speed operation of the bipolar transistor. In addition, since the autodoping is eliminated, the element isolation region is shallowed and an isolation width is reduced by forming the element active region to be as thin as 0.5 to 1 μm. Therefore, the bipolar integrated circuit can be miniaturized, and a high packing density of elements is effectively achieved.

In the bipolar transistor manufactured by the method of the present invention, the collector resistance is greatly reduced. Therefore, when the above aluminum is used, the switching rate is improved by 50%, and the size of the bird's beak of the interelement isolation region can be reduced to 0.8 μm while it is 2.4 μm when a conventional 1.5 μm-thick epitaxial film is used. Thus, it is confirmed that a high packing density of the element can be advantageously achieved.

Furthermore, since the substrate and the adhesive layer are adhered together, materials of the metal ohmic contact layer or the protecting film can be selected without considering its lattice matching with respect to the substrate or the semiconductor layer, so that a material having an optimal resistance or the like can be used.

In addition, unlike the conventional structure, the structure of the present invention does not use the epitaxial growth, so that the number of manufacturing steps can be reduced and the degradation of the manufacturing yield due to the pattern shift or the abnormal growth can be eliminated.

Figure 10A:
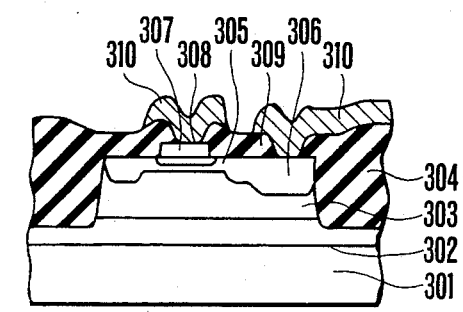
FIGS. 10(a) to 10(e) are sectional views showing steps of still another embodiment of a method of manufacturing a semiconductor device according to the present invention.
Figure 10B:
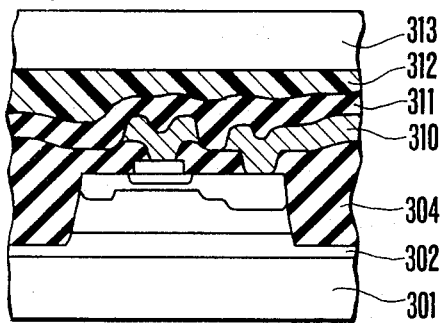
Figure 10C:
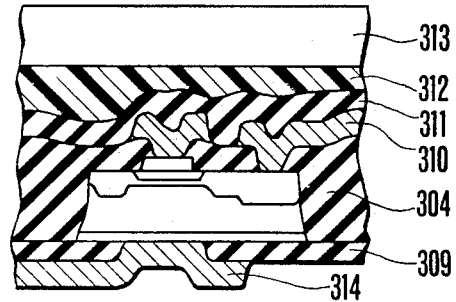
Figure 10D:
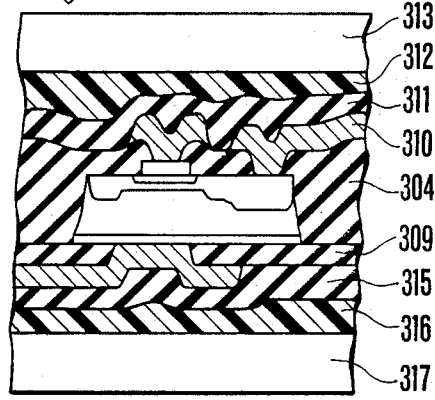
Figure 10E:
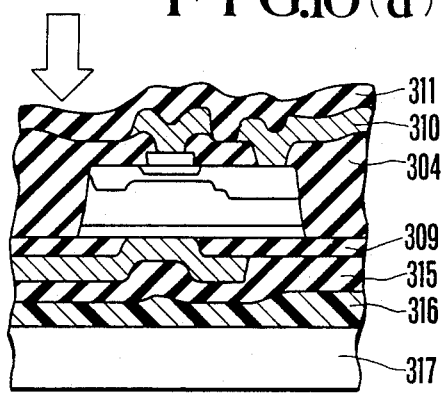

FIGS. 10(a) to 10(e) are schematic sectional views showing the steps of another embodiment of a method of manufacturing an npn bipolar transistor. Arsenic is ion-implanted into the entire surface of a p-type silicon substrate 301 having a specific resistance of about 10 Ω.cm to form an n-type high-concentration impurity layer 302. Subsequently, an epitaxial layer 303 having a thickness of about 1 μm by the chemical vapor deposition method, and then a 1 μm-thick field insulating film 304 for element isolation is formed by the LOCOS method. A p-type base diffusion region 305 and a p$^+$-type base contact region 306 are formed by ion-implantation and annealing, and polycrystalline silicon containing an n-type impurity is deposited by the CVD method and then removed except in the emitter region by photolithography. Proper annealing is performed to form an n-type emitter diffusion region 307 and an emitter contact region 308. Thereafter, an interlayer insulating film 309 such as a silicon oxide film is deposited by the CVD method, respective contact holes are opened, aluminum is sputter-deposited, and then wiring patterns are formed using photolithography. Thus, base and emitter electrode wirings 310 are obtained, and the structure of FIG. 10(a) is formed. A protecting film 311 such as a silicon oxide film is deposited by the low temperature CVD method, an adhesive layer 312 such as an epoxy high polymeric resin is spin-coated, and another supporting substrate 313 such as a glass plate is adhered thereto, as shown in FIG. 10(b). Then, the silicon substrate 301 is removed from its back surface by the mechano polishing method till the bottom of the field insulating film 304 is exposed. For example, when colloidal silica as a grit and an organic amine as a chemical liquid are used, the silicon layer can be polished using the field insulating film 304 as a stopper to obtain a thin, flat, and smooth silicon surface. Subsequently, a silicon oxide film as an interlayer insulating film 309 is deposited on the polished silicon surface layer by the low temperature CVD method such as an optical CVD or an ECR plasma CVD. Then, contact holes are opened by photolithography, and a metal film such as aluminum is sputter-deposited to form a collector electrode wiring 314. At this time, if the collector electrode is to be connected to the base or emitter wiring, the field oxide film at the portion to be connected may be opened simultaneously with contact holes to perform metal film wiring, as shown in FIG. 10. A protecting film (such as a silicon oxide or nitride film) 315 is deposited, and then an insulating adhesive layer 316 having the property different from that of the material of the adhesive layer 312 is formed on the protecting film 315 and another supporting substrate 317 is adhered thereto, as shown in FIG. 10(d). Organic high polymeric materials such as a polyimide resin and inorganic low-melting materials such as lead glass can be used for the adhesive layer 316, a heat dissipating metal plate in addition to a glass substrate or a silicon substrate can be selected as the supporting substrate 317 in accordance with the element characteristics. Finally, the resultant structure is dipped into a solvent such as the TRICRENE, which melts the contact layer 312 without affecting the adhesive layer 316, thereby easily stripping the supporting substrate 313. The resultant structure is shown in FIG. 10(e).

Figure 11:
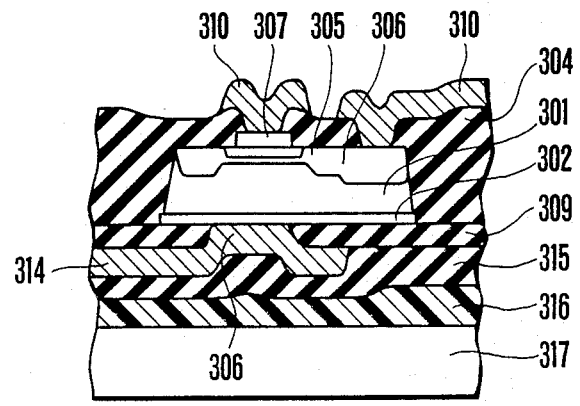
FIG. 11 is a sectional view of a bipolar transistor manufactured by the method of FIG. 10.

The protecting film 311 on the bonding pad is removed by photolithography to obtain the structure shown in FIG. 11. With this structure, the unit size can be reduced to 14 μm while it is 21 μm in the conventional structure in which the base, emitter, and collector wirings are formed at one side of the semiconductor layer, thereby achieving a high packing density.

Figure 12:
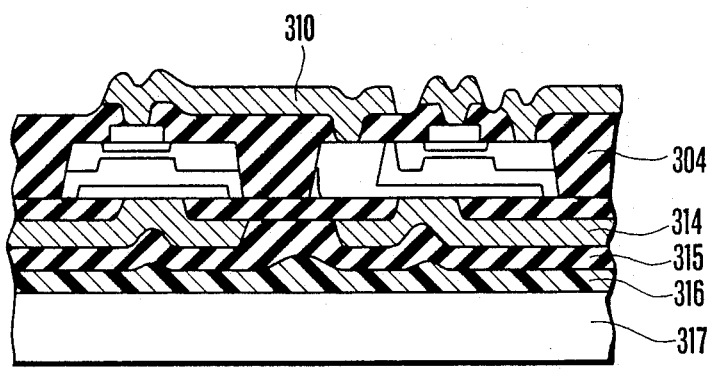
FIG. 12 is a sectional view of another bipolar transistor manufactured by the method of FIG. 10.

FIG. 12 shows another semiconductor device manufactured by the method of FIGS. 10(a) to 10(e). In this semiconductor device, the collector electrode wiring 314 is formed both in the base/emitter region side and the high-concentration impurity diffusion region side. As in this embodiment, the wiring layer can be so selected as to minimize the collector wiring distance for complex wiring.

In the first and second embodiments, the base and emitter regions are formed to be on the surface, but the collector electrode wiring side may be formed to be on the surface.

In the bipolar transistor according to the above embodiment, since the collector electrode wiring can be formed as a layer different from that of the base and emitter regions, an area required for wirings can be reduced. In addition, when the collector electrode is not provided in the base/emitter surface but is formed in the high-concentration impurity region, the unit size of the transistor is significantly reduced to greatly improve the high packing density of elements. When a complex circuit is to be manufactured, the collector wiring distance can be reduced, thereby advantageously achieving the high speed of the element.

Figures 13A, 13B, 13C, 13D, 13E:
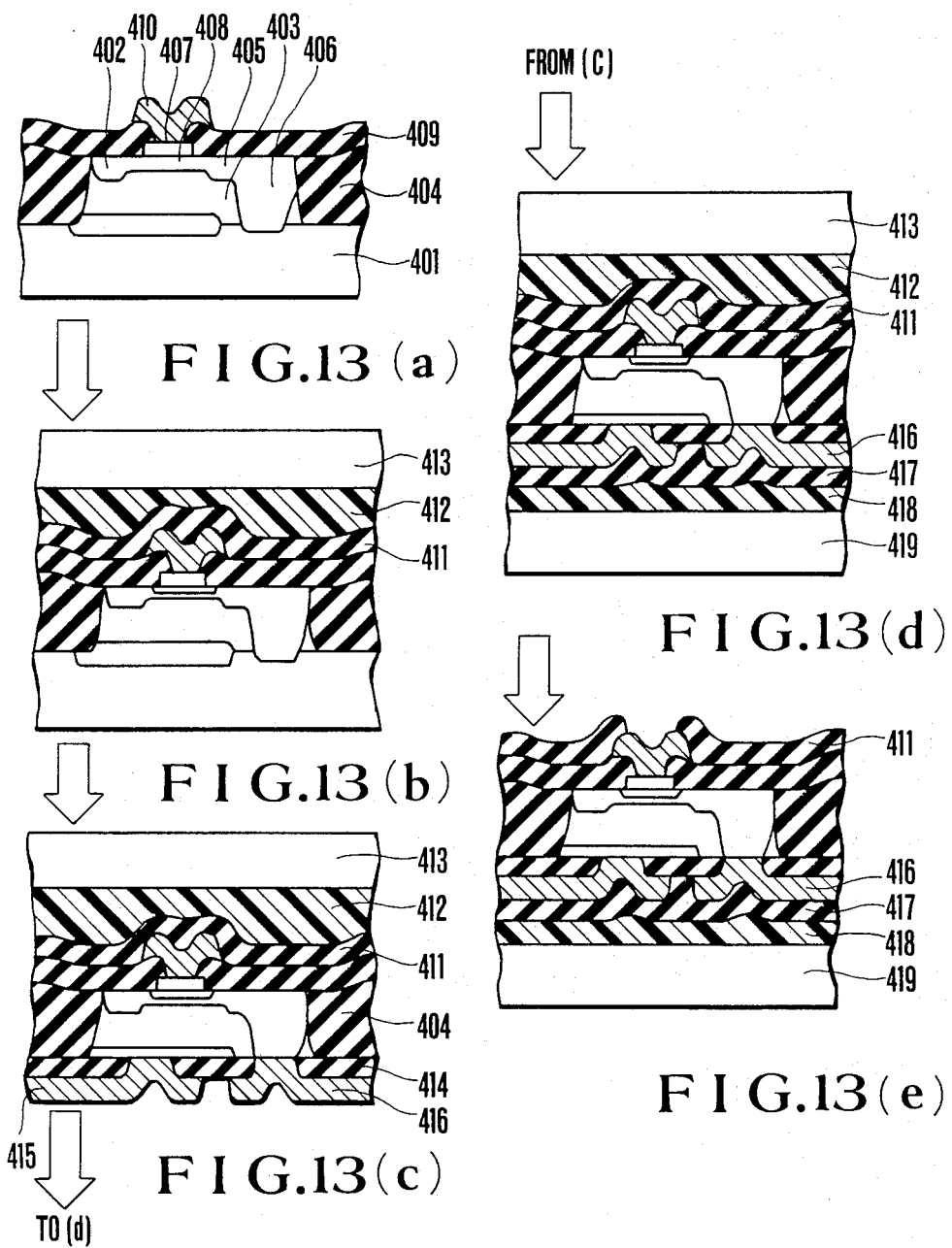
FIGS. 13(a) to 13(e) are sectional views showing steps of still another embodiment of a method of manufacturing a semiconductor device according to the present invention.

FIGS. 13(a) to 13(d) show the steps of still another embodiment of the method of the present invention. First, boron is ion-implanted into a region to serve as a collector diffusion region on a p-type silicon substrate 401 having a specific resistance of about 10 $\Omega$.cm by photolithography to form an $n^+$-type impurity layer 402. Subsequently, an epitaxial layer 403 having a thickness of about 1 μm is grown by the chemical vapor deposition, and a 1 μm-thick field oxide film 404 for element isolation is formed by the LOCOS method. High-concentration boron is doped by photolithography and ion-implantation and then diffused to reach at least the bottom of the field oxide film 404 by annealing. Low-concentration boron is ion-implanted including a part of the base contact region 406 to form a base diffusion region 405 by proper annealing. Thereafter, polycrystalline silicon containing an n-type impurity is deposited by the CVD method and then removed except in the emitter region by photolithography. Proper annealing treatment is performed to form an n-type emitter diffusion region 407 and an emitter contact region 408. Then, an interlayer insulating film 409 such as a silicon oxide film is deposited by the CVD method, respective contact holes are opened, aluminum is sputter-deposited, and wiring patterns are formed by photolithography. Thus, an emitter electrode wiring 410 is obtained, and the structure shown in FIG. 13(a) is formed.

After a protecting film 411 such as a silicon oxide film is deposited by the low temperature CVD method, an adhesive layer 412 such as an epoxy high polymeric resin is spin-coated, and another supporting substrate 413 such as a glass plate is adhered thereto, as shown in FIG. 13(b). Then, the silicon substrate 401 is removed from its back surface by the mechano polishing method till the bottom of the field oxide film 404 is exposed. For example, colloidal silica as a grit and an organic amine as a chemical liquid are used, the silicon layer can be polished using the silicon oxide film 404 as a stopper to obtain a thin, flat, and smooth silicon surface. Subsequently, a silicon oxide film as an interlayer insulating film 414 is deposited on the polished silicon surface layer by the low temperature CVD method such as an optical CVD or an ECR plasma CVD. Then, contact holes are opened by photolithography, and a metal film such as aluminum is sputter-deposited to form a collector electrode wiring 415 and a base electrode wiring 416. At this time, if the collector electrode is to be connected to the base/emitter wiring side, the field oxide film at the portion to be connected is opened simultaneously with contact holes to perform metal film wiring, as shown in FIG. 13(c).

A protecting film (such as a silicon oxide film or a silicon nitride film) 417 is deposited, an adhesive layer 418 having the property different from that of the adhesive layer 412 is formed on the protecting film 417, and then another supporting substrate 419 is adhered thereto, as shown in FIG. 13(d). Organic high polymeric materials such as a polyimide resin and inorganic low-melting materials such as lead glass can be used as the adhesive layer 418, and a heat dissipation metal plate can be selected as the supporting substrate 419 in addition to the glass substrate and the silicon substrate in accordance with the element characteristics. Finally, the resultant structure is dipped into a solvent such as the TRICRENE, which melts the adhesive layer 412 without affecting the adhesive layer 418, thereby easily stripping the supporting substrate 413. The resultant structure is shown in FIG.13(e).

Figure 14:
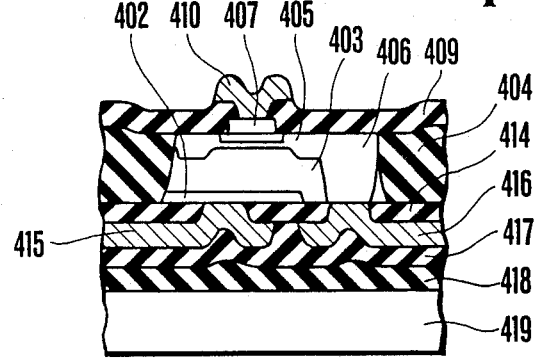
FIG. 14 is a sectional view of a bipolar transistor manufactured by the method of FIG. 13.

In the structure shown in FIG. 13(e), the protecting film 411 on the bonding pad is removed by photolithography to obtain the bipolar transistor shown in FIG. 14.

Figure 1:
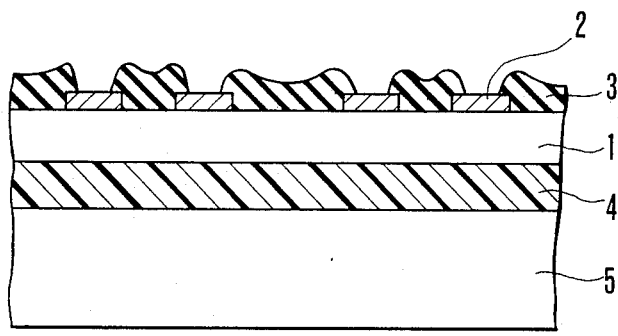
FIG. 1 is a sectional view of a semiconductor device according to a prior art.
Figure 2:
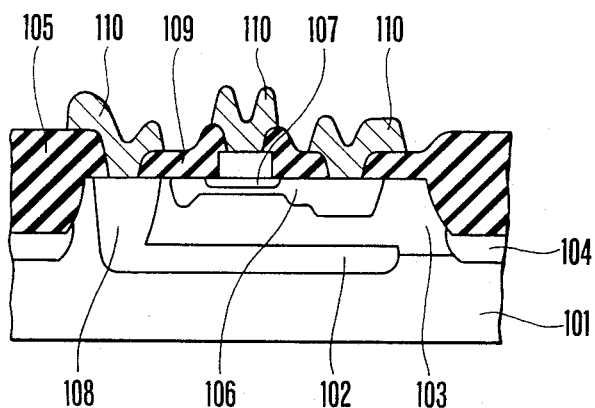
FIG. 2 is a sectional view of a bipolar transistor according to the prior art.

In this embodiment, the base electrode wiring is formed in the collector electrode side, but it may be formed in the emitter electrode side or in both sides in a single element, so that the wiring length can be freely reduced. As a matter of course, the collector side may be formed to be on the surface. In the structure of the bipolar transistor according to the above embodiment, since the collector diffusion region is formed near the base impurity diffusion region to reduce an area occupied by the collector diffusion region, the collector resistance is reduced to achieve a high speed of the element. In addition, since the collector electrode wiring is formed to be connected to the n+-type buried impurity layer 1, the collector diffusion region 108 need not be formed in the semiconductor surface at the emitter region side, and the unit size of the transistor can be reduced to the sum of the base and emitter sizes. For example, when the conventional bipolar transistor shown in FIG. 2 is manufactured by the 2 μm design rule and the alignment margin of ±0.5 μm, 4 μm is required for each of the emitter, collector, and base regions which require contact portions. Furthermore, 4 μm is required at both sides of the field oxide film including the bird's beak, so that a unit size of 21 μm is obtained with the alignment margin.

On the other hand, when the structure according to the present invention is used, 4 μm of the collector region and the margins at both sides are omitted, so that a unit size of 21−7=14 μm is obtained.

What is claimed is:

1. A bipolar transistor obtained by forming emitter, base, collector regions sequentially in a semiconductor layer surrounded by an insulative element isolation region, and forming the semiconductor layer on a supporting substrate through an insulating layer, comprising at least a high-concentration impurity layer formed in a part of said semiconductor layer at the side opposite to the emitter region, a collector electrode wiring connected to said high-concentration impurity layer, a base impurity diffusion region, formed in a part of said semiconductor layer not contacting said high-concentration impurity layer so as to extend through said semiconductor layer, and having a conductivity opposite to that of said collector impurity, and a base electrode wiring connected to said base impurity diffusion region.

2. A semiconductor device comprising:
a substrate;
an insulating layer formed on said substrate, said substrate being adhered to said insulating layer by an insulative adhesive layer;
a semiconductor device element formed on said insulating layer so as to include first regions and second regions thereof at an insulating layer side and at an opposite side of said semiconductor device element, respectively;
a field oxide film formed on said insulating layer so as to surround said semiconductor device element;
an insulator film formed to cover said semiconductor device element and said field oxide film;
a contact hole formed through said insulator film;
first electrode wirings connected via said contact hole to an insulator film side surface of said second regions of said semiconductor device element; and
second electrode wirings formed in said insulating layer and connected to a first insulating layer side surface of said first regions of said semiconductor device element.

3. A bipolar transistor comprising:
a semiconductor layer formed on a supporting substrate through an insulating layer adhered to said supporting substrate by an insulative adhesive layer, and surrounded by an insulative element isolation region, with collector, base and emitter regions of said bipolar transistor being sequentially formed in said semiconductor layer;
a film composed of a material selected from a metal and a metal silicide, and formed on at least a part of a collector region side surface of said semiconductor layer so as to form an ohmic contact with the collector region side surface of said semiconductor layer; and
a collector electrode wiring formed in said insulating layer to be connected with an insulating layer side surface of said collector region.

4. A semiconductor device comprising:
a substrate;
an insulating layer formed on said substrate being adhered to said insulating layer by an insulative adhesive layer;
a semiconductor device element formed on said insulating layer so as to include first regions and second regions thereof at an insulating layer side and an opposite side thereof, respectively;
a field oxide film formed on said insulating layer so as to surround said semiconductor device element;
an insulator film formed to cover said semiconductor device element and said field oxide film;
a first contact hole formed through said insulating film;
first electrode wirings connected via said first contact hole to an insulator film side surface of said second regions of said semiconductor device element;
a second contact hole formed through said insulator film, said field oxide film surrounding said semiconductor device element, and a part of said insulating layer; and
second electrode wirings connected via said second contact hole to a first insulating layer side surface of said first regions of said semiconductor device element.

5. A bipolar transistor comprising:
a supporting substrate;
a first insulating layer formed on said supporting substrate;

a transistor element formed on said first insulating layer with collector, base, and emitter regions thereof being sequentially formed from a first insulating layer side;

a second insulating layer formed on said transistor element;

a collector contact region formed in said collector region so as to connect said collector region to a second insulating layer side surface of said transistor element;

a metal film formed on a first insulating layer side surface of said transistor element so as to be connected with said collector contact region;

emitter, base, and collector wirings connected to said emitter region, said base region, and said collector contact region through respective contact holes formed through said second insulating layer.

6. A bipolar transistor comprising:

a supporting substrate;

a first insulating layer formed on said supporting substrate;

a transistor element formed on said first insulating layer with collector, base, emitter regions thereof being sequentially formed from a first insulating layer side;

a second insulating layer formed on said transistor element;

a base contact region formed in said base region so as to connect said base region to a first insulating layer side surface of said transistor element;

a metal film formed on the first insulating layer side surface of said collector region;

an emitter electrode wiring connected to said emitter region via a first contact hole formed through said second insulating layer;

a collector electrode wiring connected to said metal film through a second contact hole formed in said first insulating layer; and a base electrode wiring connected to as first insulating layer side surface of said base contact region through a third contact hole formed in said first insulating layer.

7. A bipolar transistor comprising:

a supporting substrate;

a first insulating layer formed on said supporting substrate;

a transistor element formed on said first insulating layer with emitter, base, and collector regions thereof being sequentially formed from a first insulating layer side;

a second insulating layer formed on said first insulating layer so as to surround said transistor element;

a metal film formed on a surface of said collector region;

an emitter electrode wiring connected with said emitter region through a contact hole formed in said first and second insulating layers and extending from a first insulating layer side surface of said emitter region to an outside surface of said second insulating layer; and a collector electrode wiring connected with said metal film.

* * * * *